US006232669B1

(12) United States Patent
Khoury et al.

(10) Patent No.: US 6,232,669 B1
(45) Date of Patent: May 15, 2001

(54) CONTACT STRUCTURE HAVING SILICON FINGER CONTACTORS AND TOTAL STACK-UP STRUCTURE USING SAME

(75) Inventors: Theodore A. Khoury; James W. Frame, both of Chicago, IL (US)

(73) Assignee: Advantest Corp., Tokyo (JP)

( * ) Notice: Subject to any disclaimer, the term of this patent is extended or adjusted under 35 U.S.C. 154(b) by 0 days.

(21) Appl. No.: 09/415,913

(22) Filed: Oct. 12, 1999

(51) Int. Cl.[7] ............... H01L 23/48; H01L 23/52; H01L 29/40
(52) U.S. Cl. ............... 257/784; 257/773; 257/698; 257/48; 257/727
(58) Field of Search ............... 257/48, 698, 718, 257/719, 727, 726, 786, 773, 784, 735

(56) References Cited

U.S. PATENT DOCUMENTS

| | | | |
|---|---|---|---|
| 4,667,219 | * | 5/1987 | Lee et al. . |
| 5,006,792 | * | 4/1991 | Malhi et al. . |
| 5,959,354 | * | 9/1999 | Smith et al. . |
| 6,020,597 | * | 2/2000 | Kwak . |
| 6,104,082 | * | 8/2000 | Berlin et al. . |
| 6,114,763 | * | 9/2000 | Smith . |

* cited by examiner

Primary Examiner—Sheila V. Clark
(74) Attorney, Agent, or Firm—Muramatsu & Associates (57) ABSTRACT

A contact structure for establishing electrical communication with contact targets with improved contact performance including frequency bandwidth, contact pitch, reliability and cost. The contact structure is formed of a plurality of finger like contactors mounted on a contact substrate. Each of the contactors includes a silicon base having an inclined support portion, an insulation layer formed on the silicon base and projected from the inclined support, and a conductive layer made of conductive material formed on the insulation layer so that a beam portion is created by the insulation layer and the conductive layer, wherein the beam portion exhibits a spring force in a transversal direction of the beam portion to establish a contact force when the tip of the beam portion pressed against a contact target. An adhesive is applied for bonding the contactors to the surface of the contact substrate.

19 Claims, 9 Drawing Sheets

CONTACT STRUCTURE HAVING SILICON FINGER CONTACTORS AND TOTAL STACK-UP STRUCTURE USING SAME

FIELD OF THE INVENTION

This invention relates to a contact structure for establishing electrical contact with contact targets such as pads, electrodes, or leads of electronic circuits or devices, and more particularly, to a contact structure having beam like (silicon finger) contactors thereon and a total stack-up structure using the contact structure to be used as an interface assembly for testing semiconductor wafers, packaged semiconductor devices, IC chips, printed circuit boards and the like, with a higher speed, frequency range, density and quality.

BACKGROUND OF THE INVENTION

In testing high density and high speed electrical devices such as LSI and VLSI circuits, high performance contact structures such as probe contactors must be used for forming an interface assembly between a test system and a device to be tested. The contact structure of the present invention is not limited to the application of testing, including burn-in testing, of semiconductor wafers and die, but is inclusive of testing and burn-in of packaged semiconductor devices, printed circuit boards and the like. The feature of the present invention can also be used in more general applications including an IC lead, IC packaging, and other electrical connections. However, for the convenience of explanation, the present invention is described mainly with reference to the semiconductor wafer testing.

Figure 1:
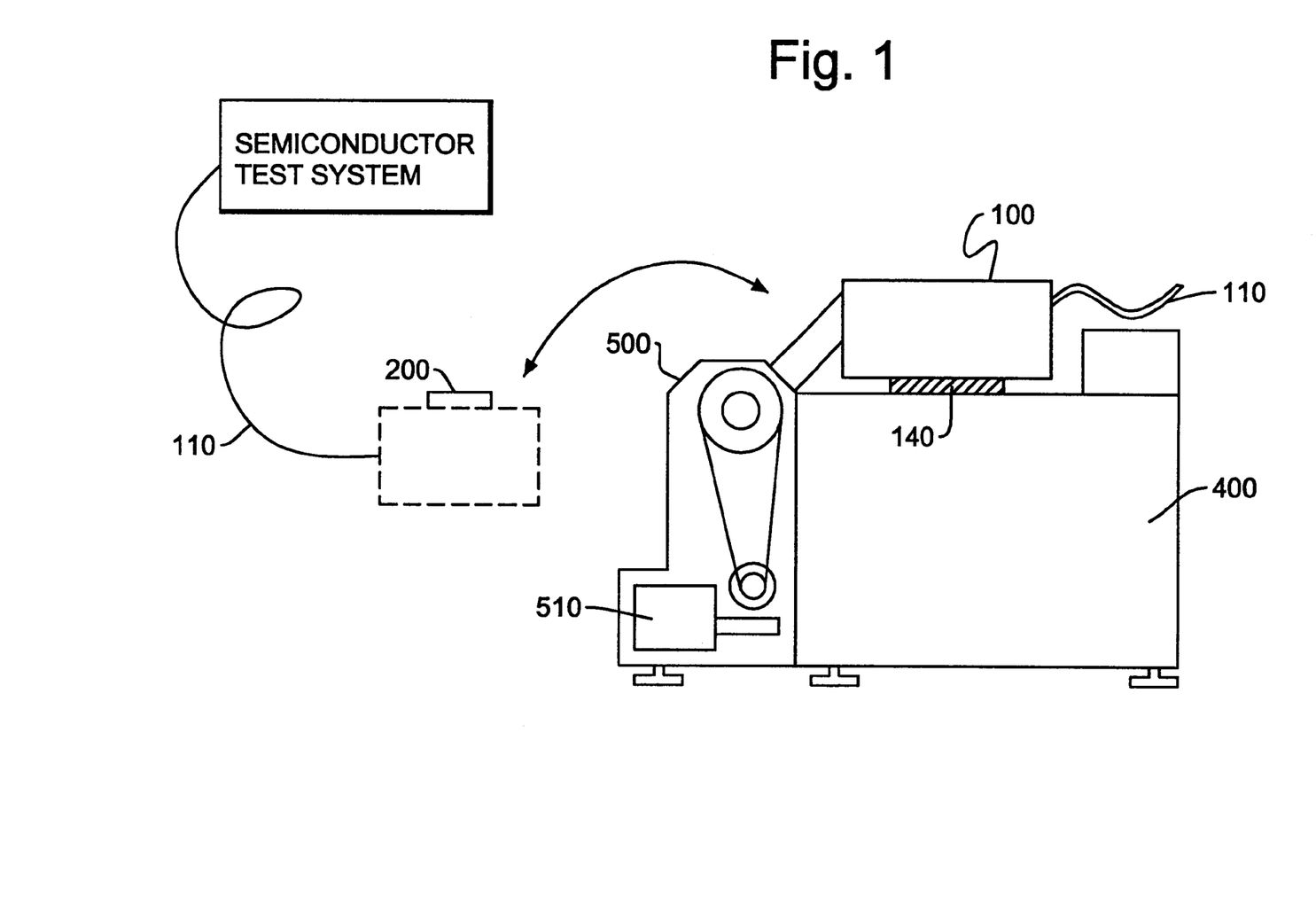
FIG. 1 is a schematic diagram showing a structural relationship between a substrate handler and a semiconductor test system having a test head.

In the case where semiconductor devices to be tested are in the form of a semiconductor wafer, a semiconductor test system such as an IC tester is usually accompanied with a substrate handler, such as an automatic wafer prober, to automatically test the semiconductor wafer. Such an example is shown in FIG. 1 in which a semiconductor test system has a test head 100 which is ordinarily in a separate housing and is electrically connected to the main frame of the test system with a bundle of cables. The test head 100 and the substrate handler 400 are mechanically connected with one another with the help of a manipulator 500 driven by, for example, a motor 510.

The semiconductor wafers to be tested are automatically provided to a test position of the test head 100 by the substrate handler 400. The resultant output (response) signals from IC circuits on the semiconductor wafer under test are transmitted to the semiconductor test system wherein they are compared with expected data to determine whether the IC circuits on the semiconductor wafer function correctly.

Figure 2:
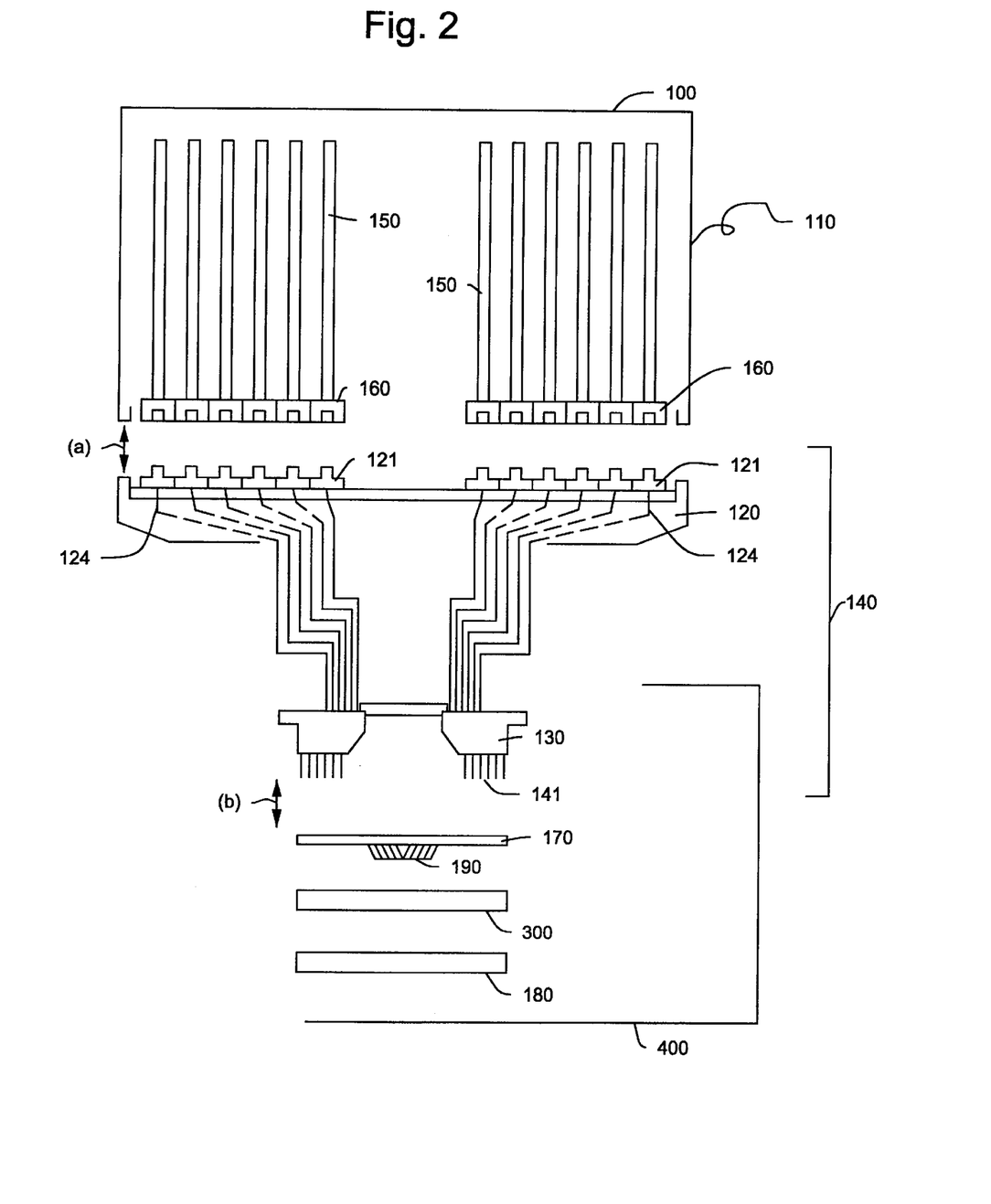
FIG. 2 is a schematic diagram showing an example of detailed structure for connecting the test head of the semiconductor test system to the substrate handler.

FIG. 2 shows, in more detail, a structure of the substrate handler (wafer prober) 400, the test head 100 and an interface assembly 140 when testing a semiconductor wafer. The test head 100 and the substrate handler 400 are connected with an interface assembly 140 consisting of a performance board, pogo-pin block, probe card, and other components. The performance board 120 of FIG. 2 is a printed circuit board having electric circuit connections unique to a test head's electrical footprint, coaxial cables, pogo-pins and connectors.

The test head 100 includes a large number of printed circuit boards 150 which correspond to the number of test channels or test pins. Each of the printed circuit boards has a connector 160 to receive a corresponding contact terminal 121 of the performance board 120. A "frog" ring (pogo-pin block) 130 is mounted on the performance board 120 to accurately determine the contact position relative to the substrate handler 400. The frog ring 130 has a large number of contact pins 141, such as ZIF connectors or pogo-pins, connected to contact terminals 121 on the performance board 120, through coaxial cables 124.

As shown in FIG. 2, the test head 100 is placed over the substrate handler 400 and mechanically and electrically connected to the substrate handler through the interface assembly 140. In the substrate handler 400, a semiconductor wafer 300 to be tested is mounted on a chuck 180. A probe card 170 is provided above the semiconductor wafer 300 to be tested. The probe card 170 has a large number of probe contactors or contactors (such as cantilevers or needles) 190 to contact with circuit terminals or contact targets in the IC circuit of the semiconductor wafer 300 under test.

Electrical terminals or contact receptacles of the probe card 170 are electrically connected to the contact pins 141 provided on the frog ring 130. The contact pins 141 are also connected to the contact terminals 121 of the performance board 120 with coaxial cables 124 where each contact terminal 121 is connected to the printed circuit board 150 of the test head 100. Further, the printed circuit boards 150 are connected to the semiconductor test system through the cable 110 having several hundreds of inner cables.

Under this arrangement, the probe contactors 190 contact the surface of the semiconductor wafer 300 on the chuck 180 to apply test signals to the semiconductor wafer 300 and receive the resultant output signals from the wafer 300. The resultant output signals from the semiconductor wafer 300 under test are compared with the expected data generated by the semiconductor test system to determine whether the semiconductor wafer 300 performs properly.

Figure 3:
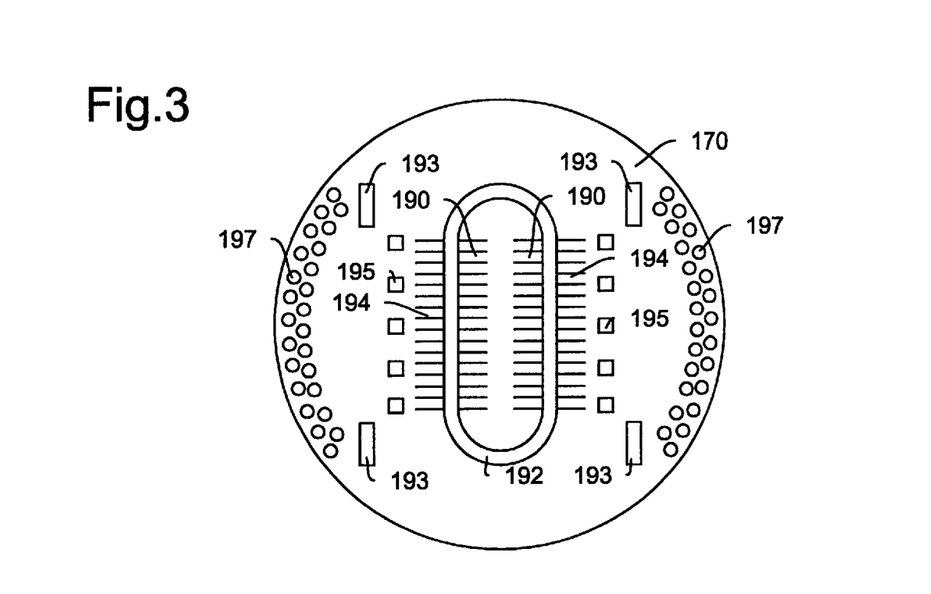
FIG. 3 is a bottom view showing an example of the probe card having an epoxy ring for mounting a plurality of cantilevers as probe contactors.

FIG. 3 is a bottom view of the conventional probe card 170 of FIG. 2. In this example, the probe card 170 has an epoxy ring on which a plurality of probe contactors 190 called needles or cantilevers are mounted. When the chuck 180 in the semiconductor wafer prober 400 mounting the semiconductor wafer 300 moves upward in FIG. 2, the tips of the cantilevers 190 contact the pads or bumps on the wafer 300. The ends of the cantilevers 190 are connected to wires 194 which are further connected to transmission lines (not shown) formed in the probe card 170. The transmission lines are connected to a plurality of electrodes 197 which contact the pogo pins 141 of FIG. 2.

Typically, the probe card 170 is structured by a multilayer of polyimide substrates having ground planes, power planes, signal transmission lines on many layers. As is well known in the art, each of the signal transmission lines is designed to have a characteristic impedance such as 50 ohms by balancing the distributed parameters, i.e., dielectric constant and magnetic permeability of the polyimide, inductances and capacitances of the signal paths within the probe card 170. Thus, the signal lines are impedance matched lines establishing a high frequency transmission bandwidth to the wafer 300 for supplying currents in a steady state as well as high current peaks generated by the device's outputs switching in a transient state. For removing noise, capacitors 193 and 195 are provided on the probe card between the power and ground planes.

An equivalent circuit of the probe card 170 is shown in FIG. 4 to explain the limitation of the high frequency performance in the conventional probe card technology. As shown in FIGS. 4A and 4B, the signal transmission line on the probe card 170 extends from the electrode 197, the strip (impedance matched) line 196, the wire 194 and the needle or cantilever (contact structure) 190. Since the wire 194 and needle 190 are not impedance matched, these portions function as an inductor L in the high frequency band as shown in FIG. 4C. Because of the overall length of the wire 194 and needle 190 is around 20–30 mm, significant limitations will be resulted from the inductor when testing a high frequency performance of a device under test.

Figure 4A:
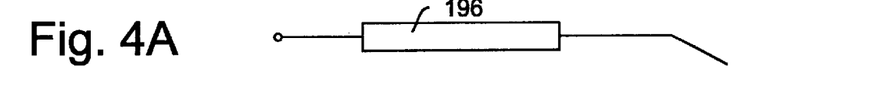
FIGS. 4A–4E are circuit diagrams showing equivalent circuits of the probe card of FIG. 3.
Figure 4B:
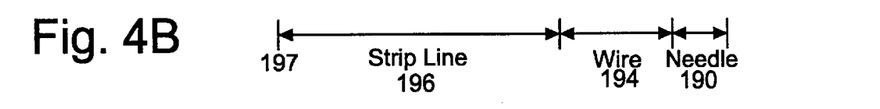
Figure 4C:
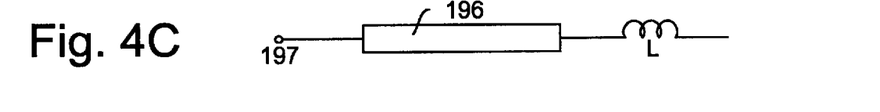
Figure 4D:
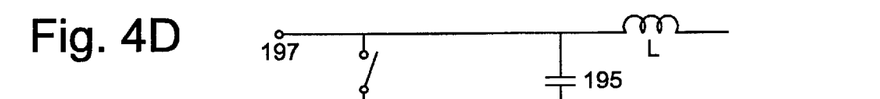
Figure 4E:
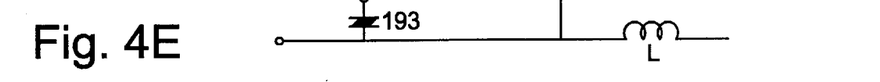

Other factors which limit the frequency bandwidth in the probe card 170 reside in the power and ground needles shown in FIGS. 4D and 4E. If the power line can provide large enough currents to the device under test, it will not seriously limit the operational bandwidth in testing the device. However, because the series connected wire 194 and needle 190 for supplying the power (FIG. 4D) as well as the series connected wire 194 and needle 190 for grounding the power and signals (FIG. 4E) are equivalent to inductors, the high speed current flow is seriously restricted.

Moreover, the capacitors 193 and 195 are provided between the power line and the ground line to secure a proper performance of the device under test by filtering out the noise or surge pulses on the power lines. The capacitors 193 have a relatively large value such as 10 $\mu$F and can be disconnected from the power lines by switches if necessary. The capacitors 195 have a relatively small capacitance value such as 0.01 $\mu$F and fixedly connected close to the DUT. These capacitors serve the function as high frequency decoupling on the power lines. In other words, the capacitors limit the high frequency performance of the probe contactor.

Accordingly, the most widely used probe contactors as noted above are limited to the frequency bandwidth of approximately 200 MHz which is insufficient to test recent semiconductor devices. In the industry, it is considered that the frequency bandwidth comparable to the tester's capability, which is currently on the order of 1 GHz or higher, will be necessary in the near future. Further, it is desired in the industry that a probe card is capable of handling a large number of semiconductor devices, especially memories, such as 32 or more, in a parallel fashion to increase test throughput.

In the conventional technology, the probe card and probe contactors such as shown in FIG. 3 are manually made, resulting in inconsistent quality. Such inconsistent quality includes fluctuations of size, frequency bandwidth, contact forces and resistance, etc. In the conventional probe contactors, another factor making the contact performance unreliable is a temperature change under which the probe contactors and the semiconductor wafer under test have different temperature expansion ratios. Thus, under the varying temperature, the contact positions therebetween vary which adversely affects the contact force, contact resistance and bandwidth.

SUMMARY OF THE INVENTION

Therefore, it is an object of the present invention to provide a contact structure and an interface assembly using the contact structure for electrically contacting with a contact target to establish electrical communication therebetween, thereby achieving a high frequency bandwidth, high pin counts and high contact performance as well as high reliability.

It is another object of the present invention to provide a contact structure and a total stack-up structure using the same to establish electrical connection in testing semiconductor integrated circuits having a very high frequency bandwidth to meet the test requirements in the next generation semiconductor technology.

It is a further object of the present invention to provide a contact structure and an interface assembly having the contact structure therein to establish electrical connection for testing semiconductor devices which are suitable for testing a large number of semiconductor devices in parallel at the same time.

It is a further object of the present invention to provide a contact structure and an interface assembly having the contact structure therein to establish electrical connection for testing semiconductor devices, which are capable of compensating temperature expansion coefficient of a semiconductor wafer under test.

In the present invention, a contact structure for establishing electrical contacts with contact targets is produced through a semiconductor production process. The contact structure is especially useful for testing a semiconductor wafer, a packaged LSI or a printed circuit board (device under test) wherein a large number of silicon finger contactors are formed through, for example, a photolithography technology and mounted on a surface of a silicon or ceramic substrate.

The contact structure of the present invention for establishing an electrical connection with a contact target, comprising:

a plurality of contactors, each of which has a contact beam which exhibits a spring force when a tip of said contactor is pressed against a contact target, each of said contactor comprising:
a silicon base having at least one inclined portion for mounting the contactor in a predetermined direction;
an insulation layer for electrically insulating the contact beam from one another; and
a conductive layer made of conductive material formed on the insulation layer thereby creating the contact beam by the insulation layer and the conductive layer;

a contact substrate for mounting the plurality of contactors, the contact substrate having a planer surface for bonding thereon the silicon base in a manner to establish the predetermined direction;

an adhesive for bonding said plurality of contactors to the planer surface of the contact substrate; and a plurality of traces provided on the contact substrate and respectively connected to the contactors to establish signal paths for electrical communication with external components.

In the contact structure of the present invention, the adhesive is applied to both sides of the plurality of contactors. Preferably, the adhesive is applied to both sides of the plurality of contactors, as well as front and rear corners formed by the planar surface of the contact substrate and the silicon base of each of contactors. More preferably, the adhesive is applied to both sides of the plurality of contactors, and to front and rear corners formed by the planar surface of the contact substrate and the silicon base of each of the contactors, and to bottom surfaces of each of the contactors.

Another aspect of the present invention is a contact assembly for establishing an electrical connection with a contact target and interfacing between the contact target and test equipment. The contact assembly is comprised of:

a contact structure having a plurality of contactors mounted on a contact substrate in predetermined directions, each of the contactors having a contact beam which exhibits a spring force when the tip of the contactor is pressed against a contact target, each of the contactor comprising a silicon base having at least one inclined portion, an insulation layer for electrically insulating said contact beam from one another, a conductive layer made of conductive material formed on the insulation layer thereby forming the contact beam by the insulation layer and the conductive layer, and a plurality of electrodes provided on the contact substrate and respectively connected to said contactors;

a conductive elastomer sheet provided on the contact structure and formed of an elastic sheet having a large number of metal wires therein in a direction orthogonal to a horizontal surface of the elastic sheet;

a probe card positioned on the conductive elastomer sheet and provided with lower electrodes on a bottom surface thereof to establish electrical communications with the electrodes of the contact structure through the conductive elastomer and upper electrodes on an upper surface thereof connected to the lower electrodes through interconnect traces; and a pin block positioned on the probe card and provided with a plurality of elastic contact pins at locations corresponding to the upper electrodes of the probe card to establish electrical communications between the probe card and external components associated with a test equipment.

According to the present invention, the contact structure has a very high frequency bandwidth to meet the test requirements in the next generation semiconductor technology. Since the contact structure is formed through a modern semiconductor production process, a large number of contactors can be aligned in a small space which is suitable for testing a large number of semiconductor devices at the same time.

Since the large number of contactors are produced at the same time on the substrate through the microfabrication technology without involving manual handling, it is possible to achieve consistent quality, high reliability and long life in the contact performance. Further, because the contactors can be fabricated on the same substrate material as that of the device under test, it is possible to compensate the temperature expansion coefficient of the device under test, which is able to avoid positional errors.

DETAILED DESCRIPTION OF THE PREFERRED EMBODIMENT

Figure 5:
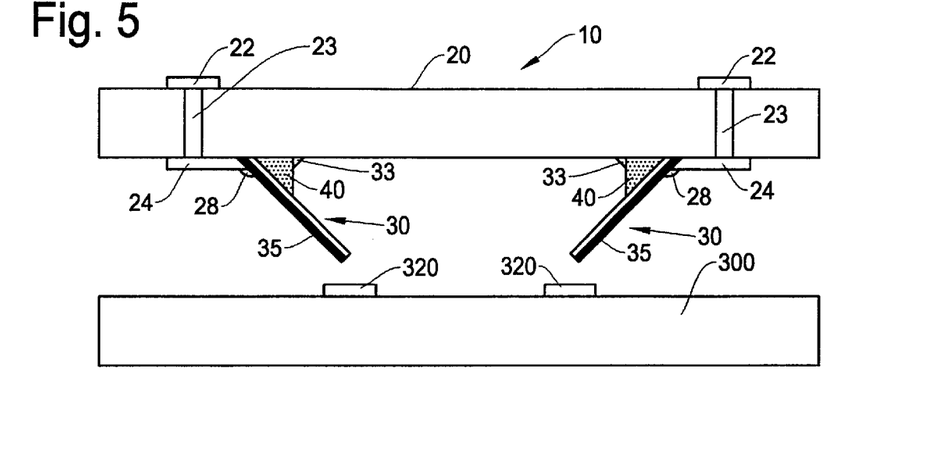
FIG. 5 is a cross sectional view showing a contact structure of a probe card mounting beam like (silicon finger) contactors of the present invention produced through a semiconductor production process and a semiconductor wafer having contact targets.

The contact structure of the present invention will be described with reference to FIGS. 5–11. FIG. 5 shows an example of a contact structure 10 having the beam like (silicon finger) contactors 30 of the present invention produced through a semiconductor production process. The contact structure 10 is basically formed of a contact substrate 20 and the silicon finger contactors 30. The contact structure 10 is so positioned over contact targets such as contact pads 320 on a semiconductor wafer 100 to be tested that the contactors 30 establish electric connections with the semiconductor wafer 100 when pressed with each other. Although only two contactors 30 are shown in FIG. 5, a large number of contactors 30 are aligned on the contact substrate 20 in actual applications such as semiconductor wafer testing.

Such a large number of contactors are produced through the same semiconductor production process such as a photolithography process on a silicon substrate and mounted on the contact substrate 20 as will be explained later. The pitch between the contact pads 320 may be as small as 50 $\mu$m or less wherein the contactors 30 on the contact substrate 20 can easily be aligned in the same pitch since they are made through the same semiconductor production process as the wafer 300 are made.

Figure 6:
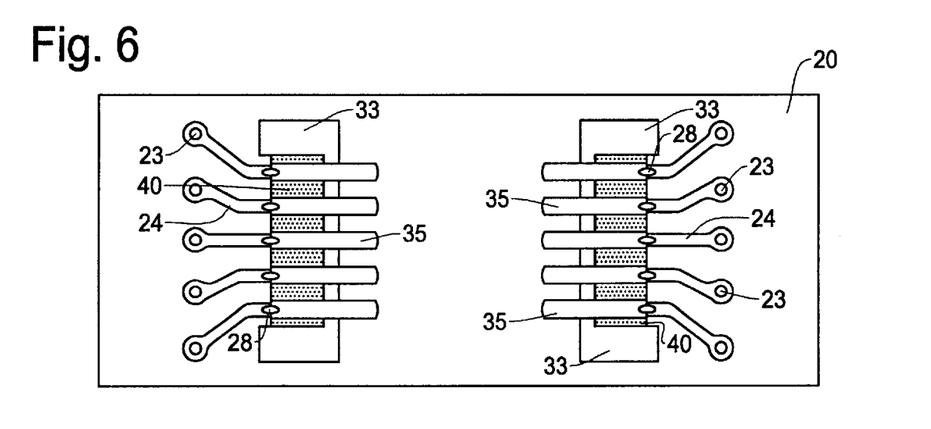
FIG. 6 is a schematic diagram showing a bottom view of the contact structure of FIG. 5 having the beam like contactors of the present invention.

The silicon finger contactors 30 can be directly mounted on the contact substrate 20 as shown in FIGS. 5 and 6 to form a contact structure which can be used as a probe card 170 of FIG. 2, or molded in a package, such as a traditional IC package having leads, so that the package is mounted on a probe card, or interconnected with other substrate. Since the silicon finger contactors 30 can be fabricated in a very small size, an operable frequency range of a contact structure or probe card mounting the contactors of the present invention can be easily increased to 2 GHz or higher. Because of the small size, the number of contactors on a probe card can be increased to, for example 2,000 or more, which is able to test as many as 32 or more memory devices in parallel at the same time.

Furthermore, because the contact structure of the present invention is formed of the contactors 30 mounted on the contact substrate 20, which is typically a silicon substrate, environmental changes such as a temperature expansion ratio of the silicon substrate are the same as those of the semiconductor wafer 300 under test. Therefore, the accurate positioning between the contactors 30 and the contact targets 320 can be maintained throughout the test.

In FIG. 5, each of the contactors 30 has a conductive layer 35 in a finger (beam) like shape. The contactor 30 also has a base 40 which is attached to the contact substrate 20. An interconnect trace 24 is connected to the conductive layer 35 at the bottom of the contact substrate 20. Such a connection between the interconnect trace 24 and the conductive layer 35 is made, for example, through a solder ball 28. The contact substrate 20 further includes a via hole 23 and an electrode 22. The electrode 22 is to interconnect the contact substrate 20 to an external structure such as a pogo-pin block or an IC package through a wire or a conductive elastomer.

Thus, when the semiconductor wafer 300 moves upward, the silicon finger contactors 30 and the contact targets 320 on the wafer 300 mechanically and electrically contact with each other. Consequently, a signal path is established from the contact target 320 to the electrodes 22 on the contact substrate 20. The interconnect trace 24, the via hole 23 and the electrode 22 also function to fan-out the small pitch of the contactors 30 to a larger pitch to fit to the external structure such as a pogo-pin block or an IC package.

Because of the spring force of the beam like shape of the silicon finger contactors 30, the end of the conductive layer 35 produces a sufficient contact force when the semiconductor wafer 300 is pressed against the contact substrate 20. The end of the conductive layer 35 is preferably sharpened to achieve a scrubbing effect when pressed against the contact target 320 for penetrating through a metal-oxide layer.

For example, if the target 320 on the semiconductor wafer 300 has aluminum oxide on its surface, the scrubbing effect is necessary to establish an electrical connection with low contact resistance. The spring force derived from the beam like shape of the contactor 30 provides an appropriate contact force against the contact target 320. The elasticity produced by the spring force of the silicon finger contactor 30 also functions to compensate the differences in size or flatness (planarity) involved in the contact substrate 20, the contact target 320 and the wafer 300, as well as the contactors 30.

An example of material of the conductive layer 35 includes nickel, aluminum, copper, nickel palladium, rhodium, nickel gold, iridium or several other depositable materials. An example of size of the silicon finger contactor 30 intended for a semiconductor test application may be 100–500 μm in overall height, 100–600 μm in horizontal length, and about 30–50 μm in width for the pitch of 50 μm or more between contact targets 320.

FIG. 6 is a bottom view of the contact substrate 20 of FIG. 5 having a plurality of silicon finger contactors 30. In an actual system, a larger number of contactors, such as several hundreds or several thousand of them, will be aligned in the manner shown in FIG. 6. The interconnect traces 24 expand the pitch of the contactors 30 to the pitch of the via holes 23 and electrodes 22 as shown in FIG. 6. Adhesives 33 are provided at contact points (inner areas of contactors 30) between the substrate 20 and the bases 40 of the contactors 30. The adhesives 33 are also provided at the sides (top and bottom of contactors 30 in FIG. 6) of the set of contactors 30. An example of adhesives 33 includes thermosetting adhesives such as epoxies, polyimide and silicone, and thermoplastic adhesives such as acrylic, nylon, phenoxy and olefin, and UV cured adhesives.

Figure 7:
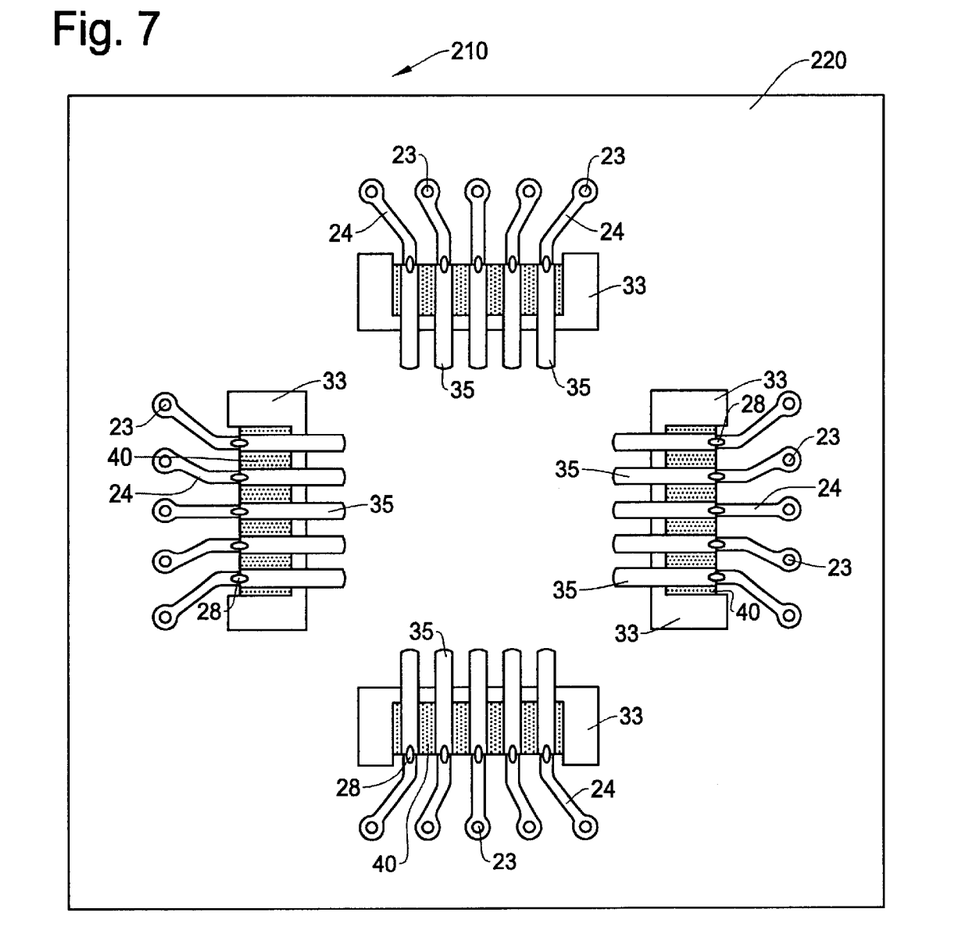
FIG. 7 is a schematic diagram showing a bottom view of another example of the contact structure of the present invention having arrays of contactors in four directions.

FIG. 7 is a bottom view showing another example of contact structure of the present invention in which contactors 30 are aligned in four directions. Similar to the example of FIGS. 5 and 6, each of the contactors 30 has a conductive layer 35, and a base 40 which is attached to the contact substrate 20. An interconnect trace 24 is connected to the conductive layer 35 at the bottom of the contact substrate 20. The interconnect trace 24 and the conductive layer 35 are connected, for example, by a solder ball 28. The contact substrate 20 further includes a via hole 23 and an electrode 22. The electrode 22 is to interconnect the contact substrate 20 to an external structure such as a pogo-pin block or an IC package through a wire or a conductive elastomer.

Since the silicon finger contactors 30 can be fabricated in a very small size, an operable frequency range of the contact structure mounting the contactors of the present invention can be easily increased to 2 GHz or higher. Because of the small size, the number of contactors on a probe card can be as many as 2,000 or more, which is able to test a large number of semiconductor devices, for example 32 or more memory ICs, in parallel at the same time.

Figure 8A:
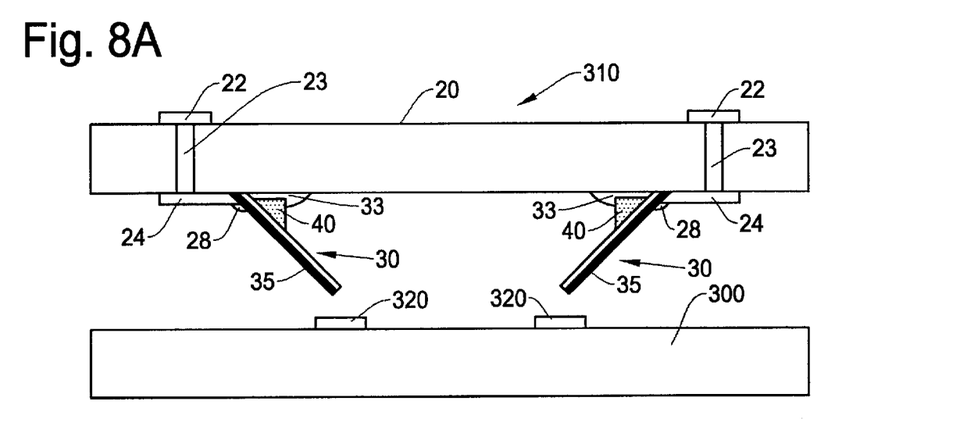
FIG. 8A is a cross sectional view of the contact structure of the present invention for showing an example of applying adhesives for mounting the beam like contactors thereon.
Figure 8B:
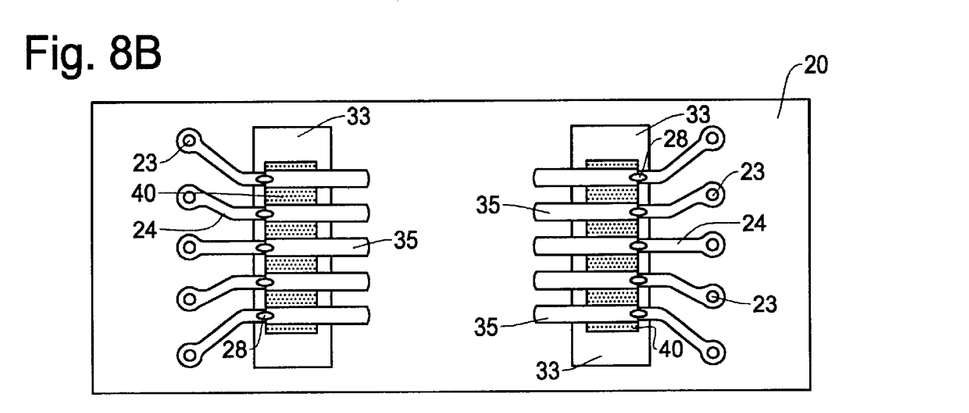
FIG. 8B is a bottom view of the contact structure of FIG. 8A.

FIGS. 8A and 8B show a further example of the contact structure of the present invention. FIG. 8A is a cross sectional view of the contact structure and FIG. 8B is a bottom view of the contact structure of FIG. 8A. Similar to the example of FIGS. 5 and 6, silicon finger contactors 30 are mounted on a contact substrate. In an actual application, a larger number of contactors, such as several hundreds or several thousand of them, will be aligned in the manner shown in FIG. 6, 7 or 8B. The interconnect traces 24 expand the pitch of the contactors 30 to the pitch of the via holes 23 and electrodes 22 as shown in FIG. 6.

Adhesives 33 are provided at front and rear contact points (inner and outer areas of contactors 30) between the substrate 20 and the bases 40 of the contactors 30. The adhesives 33 are also provided at the sides (top and bottom of the set of contactors 30 in FIG. 8B) of the set of contactors 30. The adhesives are further provided at the bottom of the contactors 30, i.e., between the bases 40 and the planar surface of the contact substrate 20 as shown in FIG. 8A. As noted above, an example of adhesives includes temperature cured adhesives and UV cured adhesives.

Figure 9:
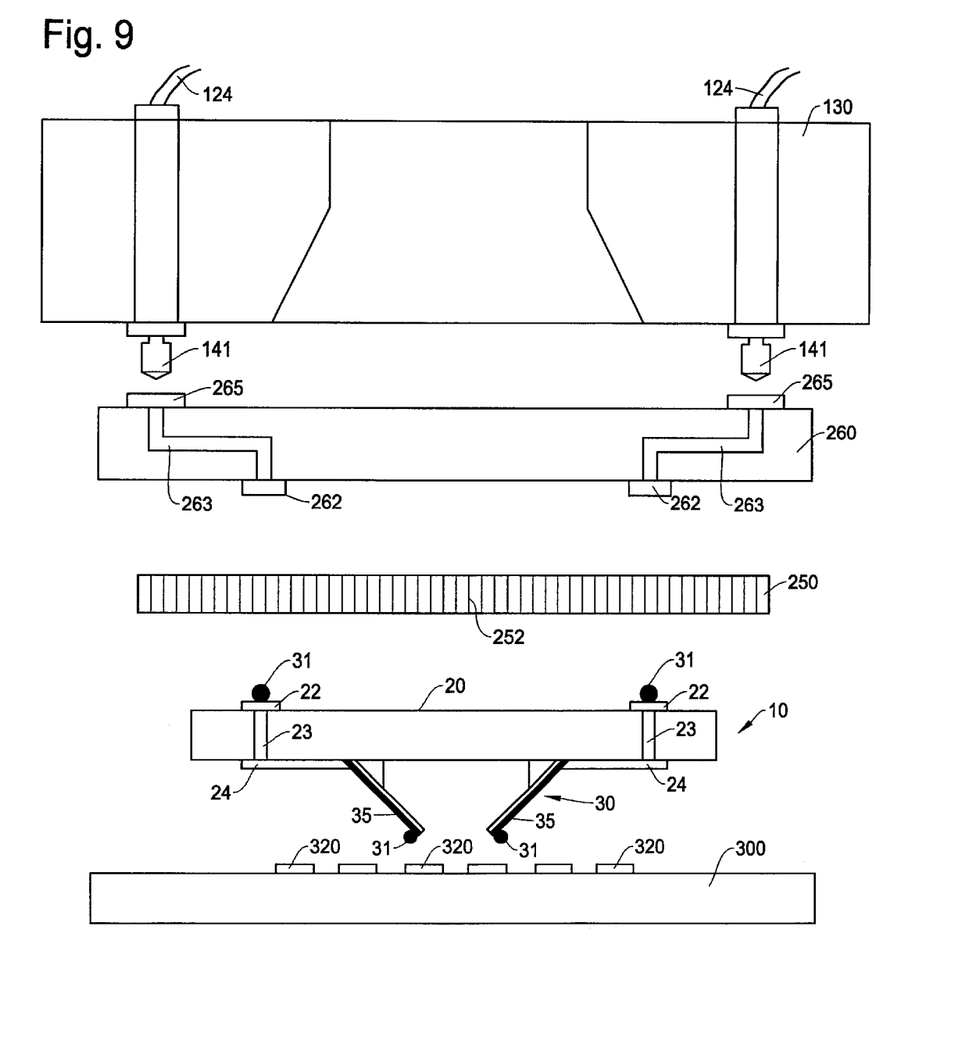
FIG. 9 is a cross sectional view showing an example of total stack-up structure using the contact structure of the present invention as an interface between the semiconductor device under test and the test head of FIG. 2.

FIG. 9 is a cross sectional view showing an example of total stack-up structure forming an interface assembly using the contact structure of the present invention. The interface assembly will be used as an interface between the semiconductor device under test and the test head of FIG. 2. In this example, the interface assembly includes a conductive elastomer 250, a routing board (probe card) 260, and a pogo-pin block (frog ring) 130 provided over the contact structure 10 in the order shown in FIG. 9.

The conductive elastomer 250, routing board (probe card) 260 and pogo-pin block 130 are mechanically as well as electronically connected with one another. Thus, electrical paths are created from the tip of the contactors 30 to the test head 100 through the cables 24 and performance board 120 (FIG. 2). Thus, when the semiconductor wafer 300 and the interface assembly are pressed with each other, electrical communication will be established between the device under test (contact pads 320 on the wafer 300) and the semiconductor test system.

The pogo-pin block (frog ring) 130 is equivalent to the one shown in FIG. 2 having a large number of pogo-pins to interface between the probe card 260 and the performance board 120. At upper ends of the pogo-pins, cables 240 such as coaxial cables are connected to transmits signals to printed circuit boards (pin electronics cards) 150 in the test head 100 in FIG. 2 through the performance board 120. The probe card 260 has a large number of contact pads or electrodes 262 and 265 on the upper and lower surfaces thereof. The electrodes 262 and 265 are connected through interconnect traces 263 to fan-out the pitch of the contact structure to meet the pitch of the pogo-pins in the pogo-pin block 130.

The conductive elastomer 250 is provided between the contact structure 10 and the probe card 260. The conductive elastomer 250 is to ensure electrical communications between the electrodes 22 of the contact structure and the electrodes 262 of the probe card by compensating planarization or vertical gaps therebetween. The conductive elastomer 250 is an elastic sheet having a large number of conductive wires in a vertical direction as will be described later.

The contact structure 10 of FIG. 9 is provided with sphere contacts 31 on the electrodes 22 and at tip portions of the conductive layer 35 of the contactor 30. Such sphere contacts may be useful depending on the surface structures and sizes of associated components. Especially, such sphere contacts are effective when provided at the tip of the contactor in establishing an relatively sharp contact point. Such a sharp contact point produces a scrubbing effect when pressed against the surface of the contact pads 320. The sphere contact 31 on the electrodes 22 may be useful when the electrodes 22 have insufficient thickness to fully contact with the conductive elastomer 250. Thus, the sphere contacts 31 may not be necessary if the electrodes 22 have sufficient thickness to fully contact with the conductive elastomer 250.

The sphere contact 31 is a hard contact ball with a diameter of 40 $\mu$m, for example, and made of glass coated with tungsten or a hard metal. Another example of the sphere contact 31 is a ball shaped contact made of a hard metal such as nickel, beryllium, aluminum, copper, nickel-cobalt-iron alloy, or iron-nickel alloy. Further, the sphere contact 31 can be formed of base metals such as nickel, aluminum, copper or other alloys as above and plated with highly conductive, non-oxidizing metals such as gold, silver, nickel palladium, rhodium, nickel gold, or iridium. The sphere contact 31 is attached to the electrode 22 by soldering, brazing, welding, or applying a conductive adhesive. The shape of the sphere contact 31 can be hemispherical so that a non-spherical portion is attached to the electrode 22.

Figure 10A:
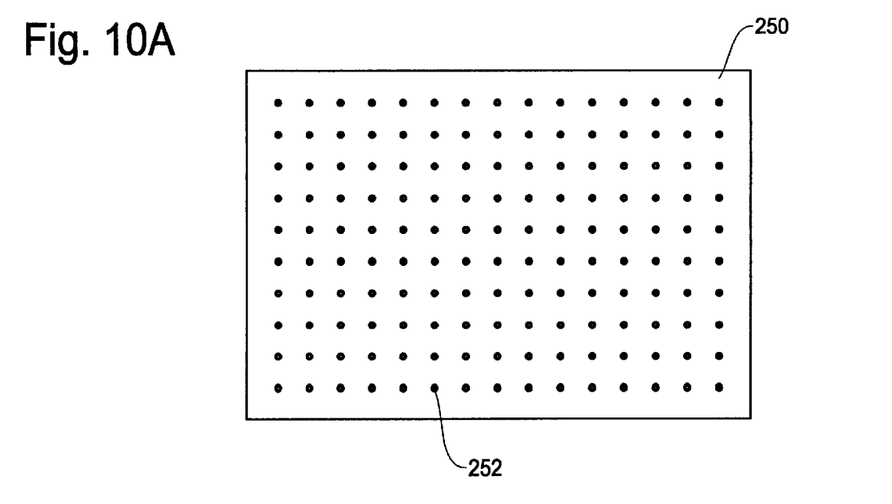
FIG. 10A is a plan view showing an example of a conductive elastomer used in the stack-up structure of FIG. 9.
Figure 10B:
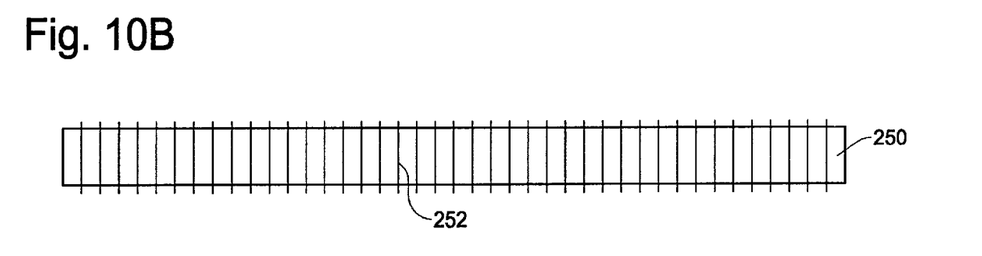
FIG. 10B is a cross sectional view of the conductive elastomer of FIG. 10A.

FIG. 10A is a plan view showing an example of conductive elastomer 250 used in the stack-up structure of FIG. 9 and FIG. 10B is a cross sectional view of the conductive elastomer of FIG. 10A. In this example, the conductive elastomer 250 is comprised of a silicon rubber sheet and a multiple rows of metal filaments 252. The metal filaments (wires) 252 are provided in the vertical direction of FIG. 9, i.e., orthogonal to the horizontal sheet of the conductive elastomer 250. An example of pitch between the metal filaments is 0.05 mm with thickness of the silicon rubber sheet is 0.2 mm. Such a conductive elastomer is produced by Shin-Etsu Polymer Co. Ltd and available in the market.

Figure 11A:
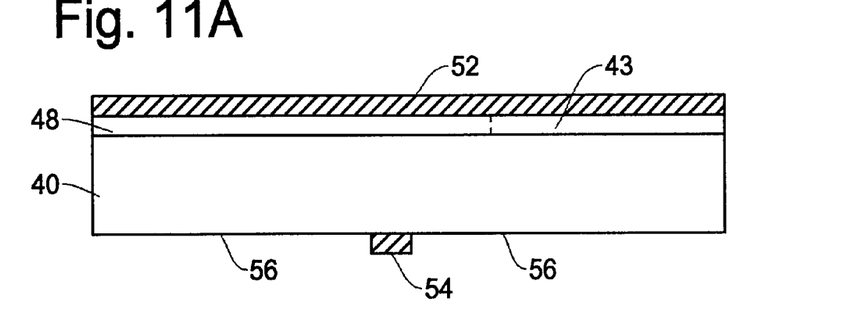
FIGS. 11A–11D are cross sectional views showing an example of process for producing the beam like (silicon finger) contactors to form the contact structure of the present invention.
Figure 11B:
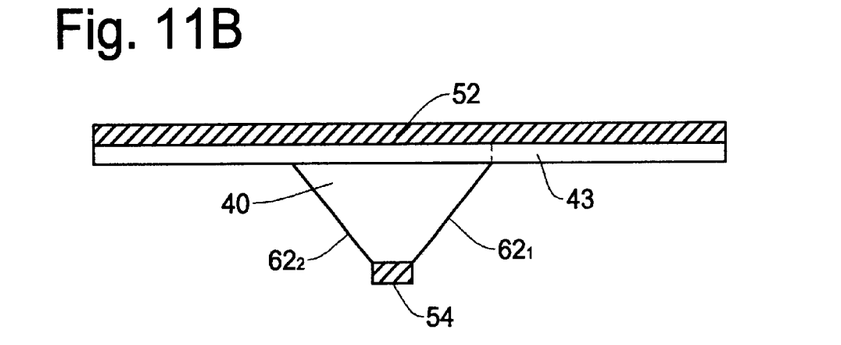
Figure 11C:
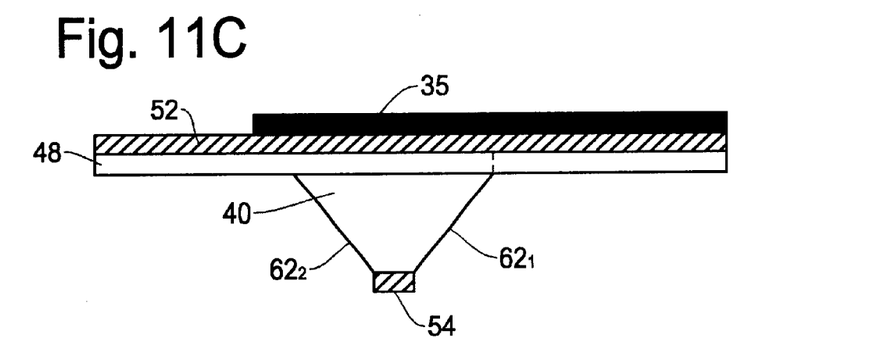
Figure 11D:
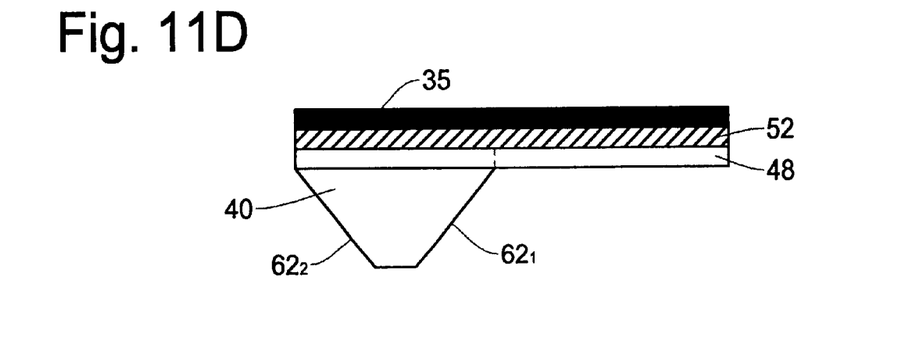

FIGS. 11A–11D are schematic cross sectional views showing an example of process for producing the contactors 30 of the present invention. More detailed descriptions of the production process as well as modified versions of the production process are given in U.S. Pat. No. 09/222,176 owned by the same assignee of the present invention. In this process, a contactor shown in FIG. 11D is produced which has two inclined (angled) portions $62_1$ and $62_2$ on the base of the contact structure. The inclined portion $62_2$ is used to mount the contactor on the planar surface of the contact substrate 20 in the manners shown in FIGS. 5 and 8A.

In FIG. 11A, a boron doped layer 48 is formed on the silicon substrate 40 wherein specific (etch-out) areas 43 are defined which are not doped with boron. A dielectric layer 52 such as silicon dioxide $SiO_2$ is provided on the boron doped layer 48 to establish as an insulation layer. A silicon dioxide $SiO_2$ layer 54 is also provided at the bottom of the silicon substrate 40 as an etch mask. An etch window 56 are defined at both sides of the substrate 40 by a photolithography process (not shown) for allowing an anisotropic etch therethrough as noted above.

The anisotropic etch process is performed on the silicon substrate 40 which creates angled portions $62_1$ and $62_2$ along the (111) crystal plane of the silicon substrate 40 as in FIG. 11B. This angle is 54.7° with respect to the bottom surface of silicon substrate 40. Alternatively, the inclined portion $62_2$ can be made by dicing the silicon substrate 40 rather than the etching process noted above. Because the specified portions 43 are not doped with the boron, the silicon substrate in these areas are etched away, leaving the finger (comb) like structure (silicon finger contactors) at both side of the silicon substrate 40. In FIG. 11C, a further photolithography process is performed to form a photoresist layer (not shown) so that a conductive layer 35 is created through a plating process. The resultant silicon finger contactors 30 are cut into an appropriate shape such as shown in FIG. 11D.

According to the present invention, the contact structure has a very high frequency bandwidth to meet the test requirements of next generation semiconductor technology. Since the contact structure is formed through a modern miniaturization technology used in the semiconductor production process, a large number of contactors can be aligned in a small space which is suitable for testing a large number of semiconductor devices at the same time. The contact structure of the present invention can also be used in more general applications including an IC lead, IC packaging, and other electrical connections.

Since the large number of contactors are produced at the same time on the substrate with the use of the microfabrication technology without involving manual handling, it is possible to achieve consistent quality, high reliability and long life in the contact performance. Further, because the contactors can be fabricated on the same substrate material as that of the device under test, it is possible to compensate the temperature expansion coefficient of the device under test, which is able to avoid positional errors.

Although only a preferred embodiment is specifically illustrated and described herein, it will be appreciated that many modifications and variations of the present invention are possible in light of the above teachings and within the purview of the appended claims without departing the spirit and intended scope of the invention.

What is claimed is:

1. A contact structure for establishing an electrical connection with a contact target, comprising:

a plurality of contactors, each of which has a contact beam which exhibits a spring force when a tip of said contactor is pressed against a contact target, each of said contactor comprising:
a silicon base having at least one inclined portion for mounting the contactor in a predetermined direction;
an insulation layer for electrically insulating said contact beam from one another; and
a conductive layer made of conductive material formed on the insulation layer thereby creating said contact beam by the insulation layer and the conductive layer;

a contact substrate for mounting said plurality of contactors, said contact substrate having a planer surface for bonding thereon said silicon base in a manner to establish said predetermined direction;

an adhesive for bonding said plurality of contactors to said planer surface of said contact substrate; and a plurality of traces provided on said contact substrate and respectively connected to said contactors to establish signal paths for electrical communication with external components.

2. A contact structure as defined in claim 1, wherein said adhesive is a temperature cured adhesive or a UV (ultra violet) cured adhesive and applied to both sides of said plurality of contactors.

3. A contact structure as defined in claim 1, wherein said adhesive is applied to both sides of said plurality of contactors, and front and rear corners formed by the planar surface of the contact substrate and the silicon base of each of said contactors.

4. A contact structure as defined in claim 1, wherein said adhesive is applied to both sides of said plurality of contactors, and to front and rear corners formed by the planar surface of the contact substrate and the silicon base of each of said contactors, and to bottom surfaces of each of said contactors.

5. A contact structure as defined in claim 1, further comprising:

a plurality of via holes on said contact substrate and connected to said plurality of contact traces for establishing electrical connection between an upper surface and a bottom surface of said contact substrate; and a plurality of electrodes connected to said plurality of via holes for establishing electrical connections to said external components.

6. A contact structure as defined in claim 1, wherein said contact substrate is a silicon substrate.

7. A contact structure as defined in claim 1, further comprising a boron doped layer between said silicon base and said insulation layer.

8. A contact structure as defined in claim 1, wherein said conductive layer is made of conductive metal and formed through a plating process.

9. A contact structure as defined in claim 1, wherein said insulation layer is made of silicon dioxide.

10. A contact assembly for establishing an electrical connection with a contact target and interfacing between the contact target and test equipment, comprising:

a contact structure having a plurality of contactors mounted on a contact substrate in predetermined directions, each of said contactors having a contact beam which exhibits a spring force when the tip of said contactor is pressed against a contact target, each of said contactor comprising a silicon base having at least one inclined portion, an insulation layer for electrically insulating said contact beam from one another, a conductive layer made of conductive material formed on the insulation layer thereby forming said contact beam by the insulation layer and the conductive layer, and a plurality of electrodes provided on said contact substrate and respectively connected to said contactors;

a conductive elastomer sheet provided on said contact structure and formed of an elastic sheet having a large number of metal wires therein in a direction orthogonal to a horizontal surface of the elastic sheet;

a probe card positioned on the conductive elastomer sheet and provided with lower electrodes on a bottom surface thereof to establish electrical communications with the electrodes of the contact structure through the conductive elastomer and upper electrodes on an upper surface thereof connected to the lower electrodes through interconnect traces; and a pin block positioned on the probe card and provided with a plurality of elastic contact pins at locations corresponding to the upper electrodes of said probe card to establish electrical communications between the probe card and external components associated with a test equipment.

11. A contact assembly as defined in claim 10, wherein said contact beam exhibits a spring force in a transversal direction of the contact beam to establish a contact force when the tip of said contact beam is pressed against the contact target.

12. A contact assembly as defined in claim 10, wherein each of said contactors further comprising a boron doped layer between said silicon base and said insulation layer.

13. A contact assembly as defined in claim 10, wherein said contact structure further comprising sphere contacts mounted on the electrodes thereof to contact with said conductive elastomer sheet.

14. A contact assembly as defined in claim 10, further comprising a boron doped layer between said silicon base and said insulation layer.

15. A contact assembly as defined in claim 10, wherein said conductive layer is made of conductive metal and formed through a plating process.

16. A contact assembly as defined in claim 10, wherein said insulation layer is made of silicon dioxide.

17. A contact assembly as defined in claim 10, wherein said adhesive is a temperature cured adhesive or a UV (ultra violet) cured adhesive and is applied to both sides of said plurality of contactors.

18. A contact assembly as defined in claim 10, wherein said adhesive is applied to both sides of said plurality of contactors, and front and rear corners formed by the planar surface of the contact substrate and the silicon base of each of said contactors.

19. A contact assembly as defined in claim 10, wherein said adhesive is applied to both sides of said plurality of contactors, and to front and rear corners formed by the planar surface of the contact substrate and the silicon base of each of said contactors, and to bottom surfaces of each of said contactors.

* * * * *